United States Patent
Cheng et al.

(10) Patent No.: US 11,494,024 B2
(45) Date of Patent: Nov. 8, 2022

(54) SIGNAL PROCESSING APPARATUS AND TOUCH DISPLAY APPARATUS THEREOF

(71) Applicant: Novatek Microelectronics Corp., Hsinchu (TW)

(72) Inventors: Yen-Cheng Cheng, Hsinchu (TW); Hsiu-Hui Yang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 16/992,122

(22) Filed: Aug. 13, 2020

(65) Prior Publication Data

US 2021/0048912 A1 Feb. 18, 2021

Related U.S. Application Data

(60) Provisional application No. 62/886,969, filed on Aug. 15, 2019.

(51) Int. Cl.
| | |
|---|---|
| *G03F 3/04* | (2006.01) |
| *G06F 3/041* | (2006.01) |
| *H03F 1/34* | (2006.01) |
| *H03F 3/68* | (2006.01) |
| *H04L 27/00* | (2006.01) |

(52) U.S. Cl.
CPC .......... *G06F 3/0416* (2013.01); *G06F 3/0412* (2013.01); *H03F 1/34* (2013.01); *H03F 3/68* (2013.01); *H04L 27/0002* (2013.01)

(58) Field of Classification Search
CPC . H03F 1/34; H03F 3/68; G06F 3/0416; G06F 3/0412; H04L 27/0002
USPC .......................................................... 375/295
See application file for complete search history.

(56) References Cited

U.S. PATENT DOCUMENTS

| | | | |
|---|---|---|---|
| 6,256,025 B1* | 7/2001 | Imai ...................... | G09G 3/3696 345/211 |
| 11,150,760 B2* | 10/2021 | Cheng ................... | G06F 3/0412 |
| 2015/0212643 A1* | 7/2015 | Lee ........................ | G06F 3/0446 345/174 |
| 2019/0310736 A1* | 10/2019 | Andrle .................. | G06F 3/0418 |

* cited by examiner

*Primary Examiner* — Kevin M Burd
(74) *Attorney, Agent, or Firm* — JCIPRNET

(57) ABSTRACT

A signal processing apparatus includes a first signal processing circuit and the second signal processing circuit. The first signal processing circuit receives a first signal. The first signal processing circuit has a power end connecting to a first voltage and a reference ground end. The second signal processing circuit receives a second signal. The second signal processing circuit has a power end which is electrically coupled to the reference ground end of the first signal processing circuit or equals the reference ground end of the first signal processing circuit. The second signal processing circuit has a reference ground end connecting to a second voltage.

14 Claims, 11 Drawing Sheets

SIGNAL PROCESSING APPARATUS AND TOUCH DISPLAY APPARATUS THEREOF

CROSS-REFERENCE TO RELATED APPLICATION

This application claims the priority benefit of U.S. provisional application Ser. No. 62/886,969, filed on Aug. 15, 2019. The entirety of the above-mentioned patent applications is hereby incorporated by reference herein and made a part of this specification.

BACKGROUND

Field of the Invention

The invention relates to a signal processing apparatus and a touch display apparatus thereof and more particularly, to the signal processing apparatus for reducing power consumption.

Description of Related Art

In a conventional touch display device, a data driving circuit is disposed for generating a plurality of data voltages for driving display pixels of a touch display panel, where a part of the data voltages are positive polarity and another part of the data voltages are negative polarity, and a plurality of touch analog front-end (AFE) circuit are disposed and configured to process touch sensing signals from touch sensors on the touch display panel. Power consumption of each touch AFE circuit is dependent upon a same voltage range, which is usually a half of a supply voltage range of the data driving circuit and is still a large consumption.

SUMMARY

The invention provides a signal processing apparatus that can save more power and a touch display apparatus thereof.

According to an embodiment of the invention, the signal processing apparatus includes a first signal processing circuit and the second signal processing circuit. The first signal processing circuit receives a first signal. The first signal processing circuit has a power end connecting to a first voltage and a reference ground end. The second signal processing circuit receives a second signal. The second signal processing circuit has a power end which is electrically coupled to the reference ground end of the first signal processing circuit or equals the reference ground end of the first signal processing circuit. The second signal processing circuit has a reference ground end connecting to a second voltage.

According to another embodiment of the invention, the touch display apparatus includes a display panel and a touch display driving device. The display panel is integrated with a touch sensor array, wherein the touch sensor array includes a plurality of touch electrodes. The touch display driving device includes a first touch analog front-end circuit and a second touch analog front-end circuit. The first touch analog front-end circuit is coupled to a first touch electrode of the touch sensor array for receiving a first signal from the first touch electrode, wherein the first signal processing circuit has a power end connecting to a first voltage and a reference ground end. The second touch analog front-end circuit is coupled to a second touch electrode of the touch sensor array for receiving a second signal from the second touch electrode, wherein the second signal processing circuit has a power end which is electrically coupled to the reference ground end of the first signal processing circuit or equals the reference ground end of the first signal processing circuit, and the second signal processing circuit has a reference ground end connecting to a second voltage.

To sum up, power ends of the first signal processing circuit and the second signal processing circuit are coupled in series. An operation currents of the first signal processing circuit can be reused by the second signal processing circuit. Such as that, power consumption of the signal processing apparatus can be reduced.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
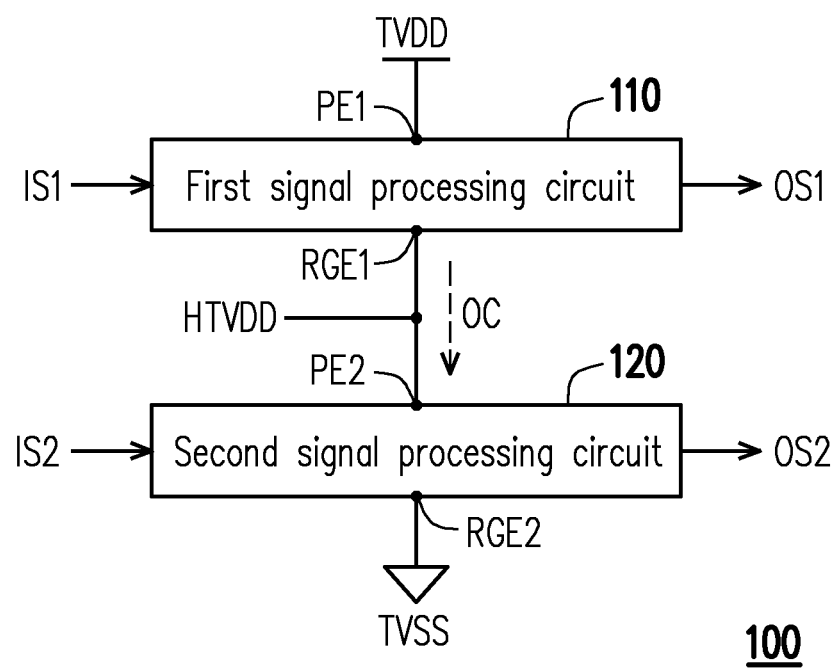
FIG. 1 is a schematic diagram of a signal processing apparatus according to an embodiment of present disclosure.

The term "couple (or connect)" throughout the specification (including the claims) of this application are used broadly and encompass direct and indirect connection or coupling means. For instance, if the disclosure describes a first apparatus being coupled (or connected) to a second apparatus, then it should be interpreted that the first apparatus can be directly connected to the second apparatus, or the first apparatus can be indirectly connected to the second apparatus through other devices or by a certain coupling means. In addition, terms such as "first" and "second" mentioned throughout the specification (including the claims) of this application are only for naming the names of the elements or distinguishing different embodiments or scopes and are not intended to limit the upper limit or the lower limit of the number of the elements not intended to limit sequences of the elements. Moreover, elements/components/steps with same reference numerals represent same or similar parts in the drawings and embodiments. Elements/components/notations with the same reference numerals in different embodiments may be referenced to the related description.

FIG. 1 is a schematic diagram of a signal processing apparatus according to an embodiment of present disclosure. The signal processing apparatus 100 includes a first signal processing circuit 110 and a second signal processing circuit 120. The first signal processing circuit 110 receives a first signal IS1. The first signal processing circuit 110 has a power end PE1 connecting to a first voltage TVDD, and the first signal processing circuit 110 has a reference ground end RGE1. On the other hand, the second signal processing circuit 120 receives a second signal IS2. The second signal processing circuit 120 has a power end PE2, and the power end PE2 is coupled to the reference ground end RGE1 of the first signal processing circuit 110. The second signal processing circuit 120 also has a reference ground end RGE2 which is coupled to a second voltage TVSS.

In this embodiment, a voltage level of the first voltage TVDD is higher than a voltage level of the second voltage TVSS. A voltage level on the power end PE1 is lower than the voltage level of the first voltage TVDD, and the voltage level on the power end PE1 is higher than the voltage level of the second voltage TVSS.

In one embodiment, the reference ground end RGE1 of the first signal processing circuit 110 may be coupled to the power end PE2 of the second signal processing circuit 120. In another embodiment, the reference ground end RGE1 of the first signal processing circuit 110 may equal to the power end PE2 of the second signal processing circuit 120. That is, the reference ground end RGE1 of the first signal processing circuit 110 and the power end PE2 of the second signal processing circuit 120 are the same end. In FIG. 1, the reference ground end RGE1 of the first signal processing circuit 110 and the power end PE2 of the second signal processing circuit 120 are commonly coupled to a third voltage HTVDD, where a voltage level of the third voltage HTVDD is between the voltage levels of the first voltage TVDD and the second voltage TVSS. In some embodiment, the voltage level of the third voltage HTVDD may be equivalent to a half of a voltage summation of the first voltage TVDD and the second voltage TVSS.

In this embodiment, the first signal IS1 received by the first signal processing circuit 110 is an analog signal. The first signal processing circuit 110 is an analog front end (AFE) circuit and is configured to process the first signal IS1 to generate a first output signal OS1. The first signal processing circuit 110 is operated based on the first voltage TVDD and the third voltage HTVDD, and an operation current OC can be generated and flows from the power end PE1 of the first signal processing circuit 110 to the reference ground end RGE1 of the first signal processing circuit 110.

On the other hand, the second signal IS2 received by the second signal processing circuit 120 is also an analog signal. The second signal processing circuit 120 is another analog front end (AFE) circuit and is configured to process the second signal IS2 to generate a second output signal OS2. Since the power end PE2 of the second signal processing circuit 120 is coupled to (or equals) the reference ground end RGE1 of the first signal processing circuit 110. An operation current in the second signal processing circuit 120 equals to the operation current OC, and flows from the power end PE2 of the second signal processing circuit 120 to the reference ground end RGE2 of the second signal processing circuit 120.

That is, in presented embodiment, the operation current OC is shared by the first signal processing circuit 110 and the second signal processing circuit, and a total power consumption $P=(TVDD-TVSS)\times 0.5\times OC$, and one-half power can be saved. In an embodiment, the first signal processing circuit and the second signal processing circuit are analog front-end (AFE) circuit for processing touch sensing signals from a touch sensor array of a touch display panel.

Figure 2:
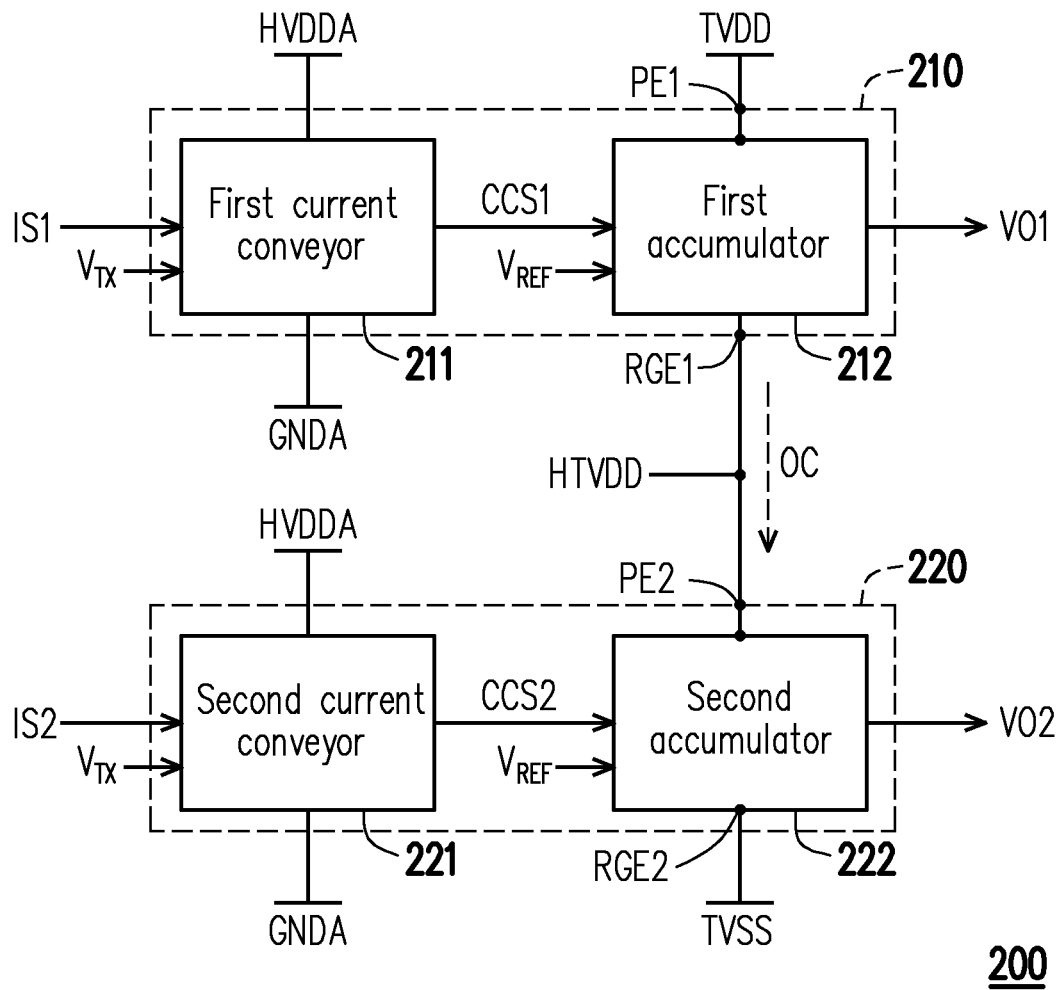
FIG. 2 is a schematic diagram of a signal processing apparatus according to another embodiment of present disclosure.

FIG. 2 is a schematic diagram of a signal processing apparatus according to another embodiment of present disclosure. In this embodiment, the signal processing apparatus 200 includes a first signal processing circuit 210 and a second signal processing circuit 220. The first signal processing circuit 210 includes a first current conveyor 211 and a first accumulator 212. The first current conveyor 211 receives a first signal IS1, and the first current conveyor 211 is coupled to the first accumulator 212. In this embodiment, the first signal IS1 may be an analog touch sensing signal which is received from a touch sensor array of a touch display panel. The first current conveyor 211 also receives a driving signal $V_{TX}$, and the first current conveyer 211 generates a first current signal CCS1 according to the first signal IS1. The driving signal $V_{TX}$ may be a touch excitation signal generated by a signal generation source and input to the first and second signal processing circuits. The first accumulator 212 receives a first voltage TVDD and a third voltage HTVDD as operation voltages by a first power end PE1 and a first reference ground end RGE1, respectively. The first accumulator 212 receives the first current signal CCS1 and generates a first accumulating result signal VO1 according to the first current signal CCS1 and a reference signal VREF, wherein the first accumulating result signal VO1 may be a differential output signal.

On the other hand, the second signal processing circuit 220 includes a second current conveyor 221 and a second accumulator 222. The second current conveyor 221 receives a second signal IS2, and the second current conveyor 221 is coupled to the second accumulator 222. In this embodiment, the second signal IS2 may be an analog touch sensing signal which is received from a touch sensor array of the touch display panel. The second current conveyor 221 also receives the driving signal $V_{TX}$, and the second current conveyer 221 generating a second current signal CCS2 according to the second signal IS2. The second accumulator 222 receives the third voltage HTVDD and a second voltage TVSS as operation voltages by a second power end PE2 and a second reference ground end RGE2, respectively. The second accumulator 222 receives the second current signal CCS2 and generates a second accumulating result signal VO2 according to the second current signal CCS2 and the reference signal VREF, wherein the second accumulating result signal VO2 may be a differential output signal. The first accumulator 212 and the second accumulator 222 are current accumulators.

It should be noted here, since the first reference ground end RGE1 and the second power end PE2 are coupled in series, the operation current OC of the first signal processing circuit 210 can also flows into the second signal processing circuit 220, and thereby charge reuse is achieved. Operation currents of the first signal processing circuit 210 and the second signal processing circuit 220 are the same the equal to the operation current OC. By using the same operation current OC, power consumption of the signal processing apparatus 200 can be saved.

Besides, in presented embodiment, both of the first current conveyor 211 and the second current conveyor 221 receive voltages HVDDA and GNDA as operation voltages, and a voltage level of the voltage HVDDA is higher than a voltage level of the voltage GNDA. In one embodiment, the voltage HVDDA and the first voltage TVDD can be the same or different, and the voltage GNDA and the second voltage TVSS can be the same or different.

Figure 3:
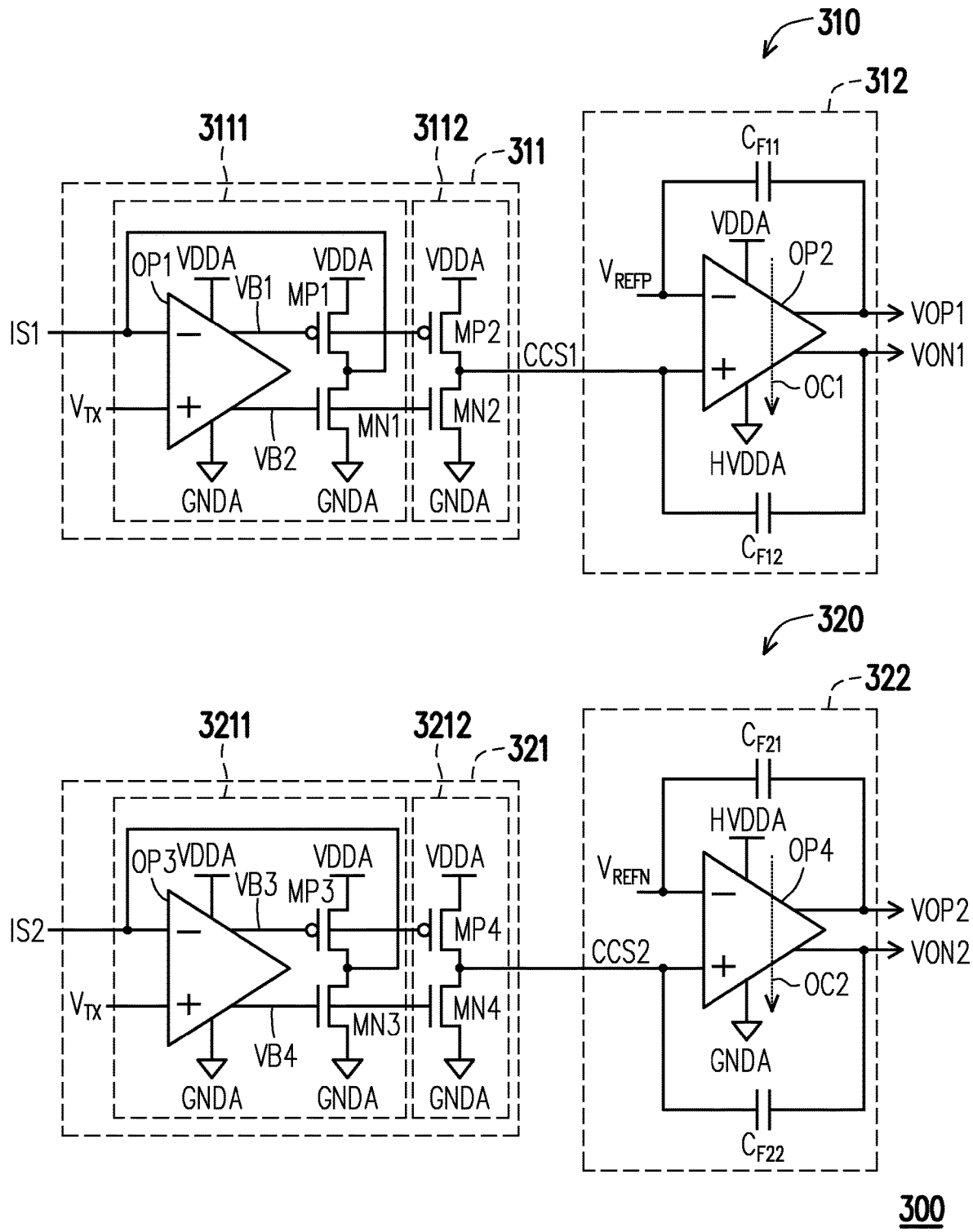
FIG. 3 is a circuit plot of a signal processing apparatus according to one embodiment of present disclosure.

FIG. 3 is a circuit plot of a signal processing apparatus according to one embodiment of present disclosure. The signal processing apparatus 300 includes a first signal processing circuit 310 and a second signal processing circuit 320. The first signal processing circuit 310 includes a first current conveyor 311 and a first accumulator 312. The second signal processing circuit 320 includes a second current conveyor 321 and a second accumulator 322. Both of the first current conveyors 311 and 321 receives a first voltage VDDA and a second voltage GNDA as operation voltages. The first accumulator 312 receives the first voltage VDDA and a third voltage HVDDA as operation voltages, and the second accumulator 322 receives the third voltage HVDDA and the second voltage GNDA as operation voltages. In here, the second voltage GNDA may be 0 volt, and the third voltage HVDDA may be one-half of the first voltage VDDA.

In this embodiment, the first current conveyor 311 includes a voltage follower 3111 and an output buffer 3112. The voltage follower 3111 has a negative input end for receiving a first signal IS1, and a positive input end for receiving a driving signal $V_{TX}$. The voltage follower 3111 generates a first current signal CCS1 according to the first signal IS1. Furthermore, the voltage follower 3111 includes an operation amplifier OP1, and the operation amplifier OP1 has an output stage circuit including transistors MP1 and MN1. A positive input end of the operation amplifier OP1 receives the first signal IS1, and a negative end of the operation amplifier OP1 receives the driving signal $V_{TX}$. The operation amplifier OP1 receives the first voltage VDDA and the second voltage GNDA as operation voltages, and is configured to generate the first current signal CCS1 according to the first signal IS1. Besides, the transistors MP1 and MN1 are coupled in series between the first voltage VDDA and the second voltage GNDA. Control ends of the transistors MP1 and MN1 respectively receive a first bias voltage VB1 and a second bias voltage VB2. Also, a connection end of the transistors MP1 and MN1 is coupled to the negative end of the operation amplifier OP1 for providing a feedback path.

The output buffer 3112 includes transistors MP2 and MN2. The transistors MP2 and MN2 are coupled in series between the first voltage VDDA and the second voltage GNDA. Control ends of the transistors MP2 and MN2 respectively receive the first bias voltage VB1 and the second bias voltage VB2, and a connection end of the transistors MP2 and MN2 is coupled to the first accumulator 312. The output buffer 3112 transfers the first current signal CCS1 to the first accumulator 312.

The second current conveyor 321 includes a voltage follower 3211 and an output buffer 3212. The voltage follower 3211 has a negative input end for receiving a second signal IS2, and a positive input end for receiving the driving signal $V_{TX}$. The voltage follower 3211 generates a second current signal CCS2 according to the second signal IS2. Furthermore, the voltage follower 3211 includes an operation amplifier OP3, and the operation amplifier OP3 has an output stage circuit including transistors MP3 and MN3. A positive input end of the operation amplifier OP3 receives the second signal IS2, and a negative end of the operation amplifier OP3 receives the driving signal $V_{TX}$. The operation amplifier OP3 receives the first voltage VDDA and the second voltage GNDA as operation voltages, and is configured to generate the second current signal CCS2 according to the second signal IS2. Besides, the transistors MP3 and MN3 are coupled in series between the first voltage VDDA and the second voltage GNDA. Control ends of the transistors MP3 and MN3 respectively receive a third bias voltage VB3 and a fourth bias voltage VB4. Also, a connection end of the transistors MP3 and MN3 is coupled to the negative end of the operation amplifier OP3 for providing a feedback path.

The output buffer 3212 includes transistors MP4 and MN4. The transistors MP4 and MN4 are coupled in series between the first voltage VDDA and the second voltage GNDA. Control ends of the transistors MP4 and MN4 respectively receive the third bias voltage VB3 and the fourth bias voltage VB4, and a connection end of the transistors MP4 and MN4 is coupled to the second accumulator 322. The output buffer 3212 transfers the second current signal CCS2 to the second accumulator 322.

The first accumulator 312 includes an operation amplifier OP2 and capacitors CF11 and CF12. The operation amplifier OP2 receives the first voltage VDDA and the third voltage HVDDA as operation voltages. The capacitor CF11 is coupled between a negative input end of the operation amplifier OP2 and an output end of the operation amplifier OP2, and the capacitor CF12 is coupled between a positive input end of the operation amplifier OP2 and the output end of the operation amplifier OP2. The negative input end of the operation amplifier OP2 receives a reference signal VREFP and the positive input end of the operation amplifier OP2 is coupled to the output buffer 3112 for receiving the first current signal CCS1. The first accumulator 312 generates first accumulating result signals VOP1 and VON1 according to the reference signal VREFP and the first current signal CCS1, where the first accumulating result signals VOP1 and VON1 are differential signals.

The second accumulator 322 includes an operation amplifier OP4 and capacitors CF21 and CF22. The operation amplifier OP4 receives the third voltage HVDDA and the second voltage GNDA as operation voltages. The capacitor CF21 is coupled between a negative input end of the operation amplifier OP4 and an output end of the operation amplifier OP4, and the capacitor CF22 is coupled between a positive input end of the operation amplifier OP4 and the output end of the operation amplifier OP4. The negative input end of the operation amplifier OP4 receives a reference signal VREFN and the positive input end of the operation amplifier OP4 is coupled to the output buffer 3212 for receiving the second current signal CCS2. The second accumulator 322 generates second accumulating result signals VOP2 and VON2 according to the reference signal VREFN and the second current signal CCS2, where the second accumulating result signals VOP2 and VON2 are differential signals.

Figure 4A:
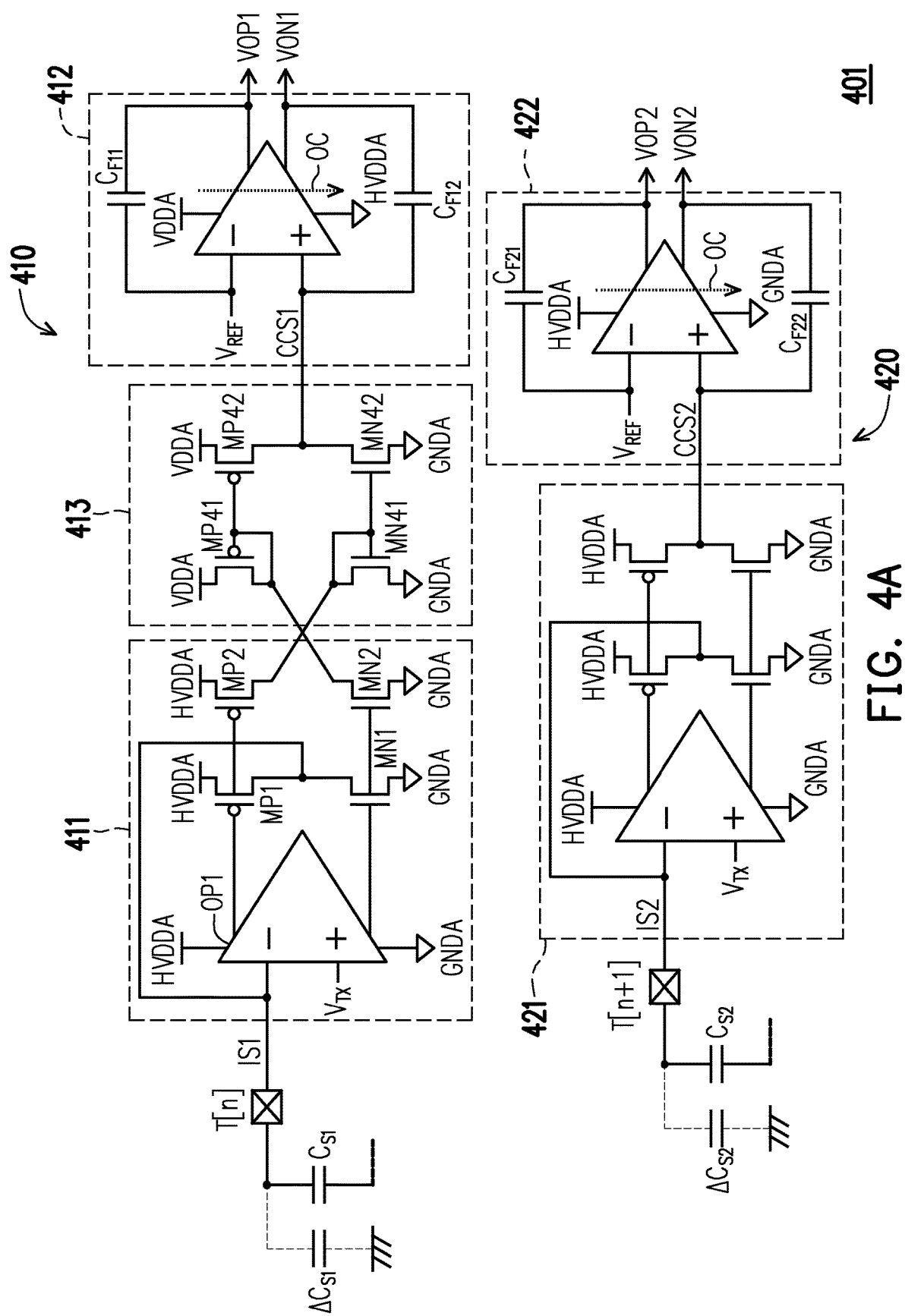
FIG. 4A is a circuit plot of another signal processing apparatus according to one embodiment of present disclosure.

FIG. 4A is a circuit plot of another signal processing apparatus according to one embodiment of present disclosure. The signal processing apparatus 401 includes a first signal processing circuit 410 and a second signal processing circuit 420. The first signal processing circuit 410 and the second signal processing circuit 420 may be coupled to respective touch electrodes, such as adjacent touch electrodes T[n] and T[n+1]. The touch electrodes T[n] and T[n+1] may be disposed in a touch sensor array integrated within a display panel. The first signal IS1 can be generated according to a capacitance variation $\Delta C_{S1}$ of a capacitor $C_{S1}$ of the touch electrode T[n], and the second signal IS2 can be generated according to a capacitance variation $\Delta C_{S2}$ of a capacitor $C_{S2}$ of the touch electrode T[n+1].

The first signal processing circuit 410 includes a first current conveyor 411, a current mirror circuit 413 and a first accumulator 412. Different from the embodiment in FIG. 3, the first current conveyor 411 formed by the operation amplifier OP1 and the transistors MP2 and MN2 receives the third voltage HVDDA and the second voltage GNDA as operation voltages. Moreover, a first end of the transistors MP2 receives the third voltage HVDDA; a second end of the transistors MP2 is couple to one end the current mirror circuit 413; a first end of the transistor MN2 is coupled to another end of the current mirror circuit 413; and a second end of the transistor MN2 receives the second voltage GNDA. The current mirror circuit 413 receives the first voltage VDDA and the second voltage GNDA as operation voltages. The current mirror circuit 413 includes transistors MP41~MN42. First ends of the transistors MP41 and MP42 receive the first voltage VDDA; a control end and a second end of the transistor MP41 are commonly coupled to the first end of the transistor MN2 and a control end of the transistor MP42; a control end and a first end of the transistor MN41 are commonly coupled to the second end of the transistor MP2 and a control end of the transistor MN42; second ends of the transistors MN41 and MN42 receive the second voltage GNDA; and a second end of the transistor MP42 is coupled to a first end of the transistor MN42.

In this embodiment, the operation voltage range (VDDA-GNDA) of the current mirror circuit 413 is different from the operation voltage range (HVDDA-GNDA) of the first current conveyor 411. The first current conveyor 411 provides a first current signal CCS1 and the current mirror circuit 413 is used to mirror the first current signal CCS1 to be operated in a different operation voltage range. In other words, since the current mirror circuit 413 performs a current transfer function, the first current conveyor 411 can be operated under a lower operation voltage (which means the third voltage HVDDA can be lower than the first voltage VDDA) and power consumption can be reduced.

On the other hand, the second signal processing circuit 420 does not include a current mirror circuit, and the second current conveyor 421 and the second accumulator 422 receive the third voltage HVDDA and the second voltage GNDA as operation voltages. As such, the operation current OC of the first accumulator 412 can flow into the second accumulator 422, and hence the charge is reused and power consumption of the signal processing apparatus 401 can be reduced, too.

Figure 4B:
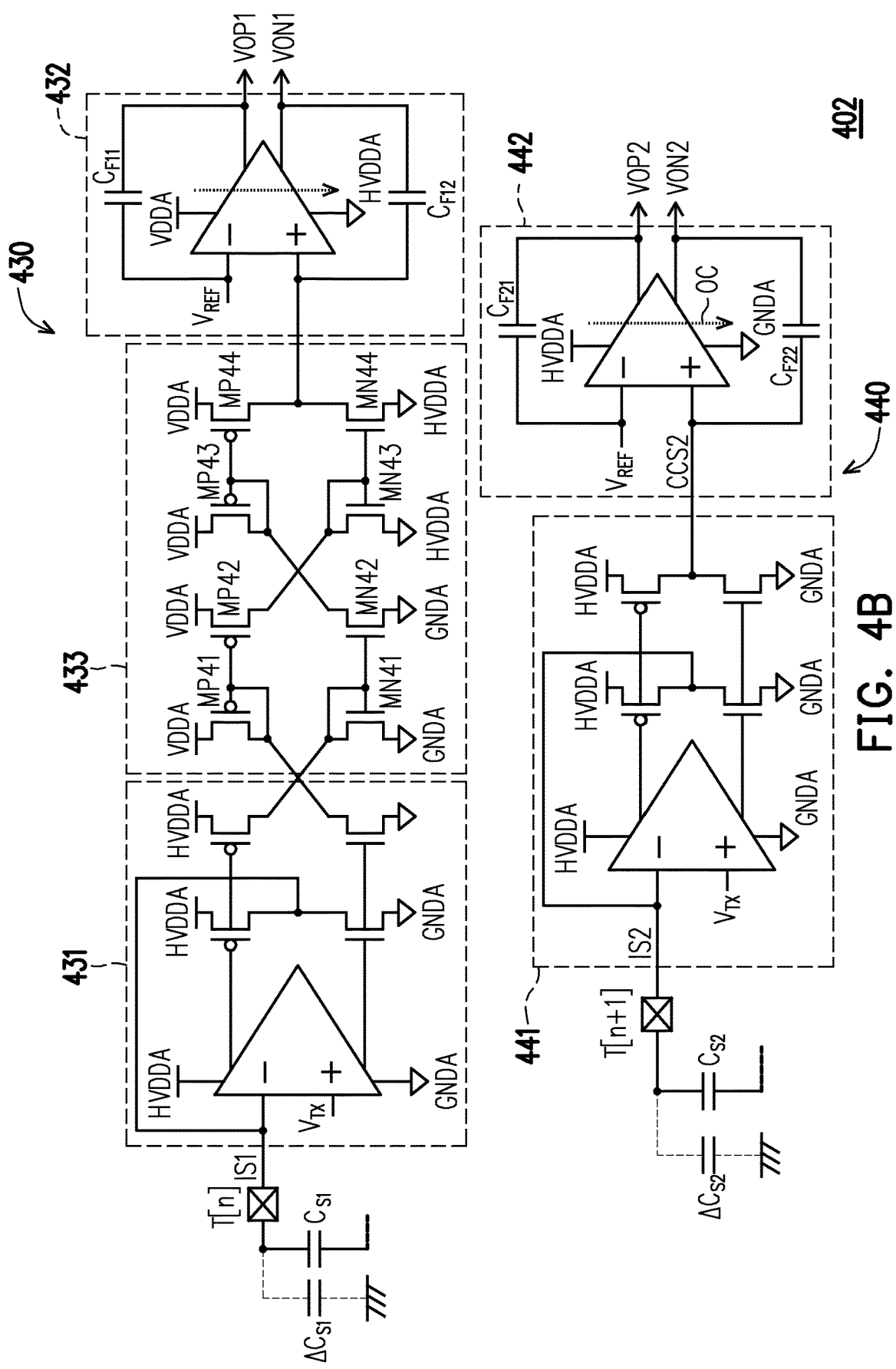
FIG. 4B is a circuit plot of another signal processing apparatus according to one embodiment of present disclosure.

FIG. 4B is a circuit plot of another signal processing apparatus according to one embodiment of present disclosure. In this embodiment, the signal processing apparatus 402 includes a first signal processing circuit 430 and a second signal processing circuit 440. The first signal processing circuit 430 includes a first current conveyor 431, a first accumulator 432 and a current mirror circuit 433. The second signal processing circuit 440 includes a second current conveyor 441 and a second accumulator 442. In this embodiment, the first current conveyor 431 receives the third voltage HVDDA and the second voltage GNDA as operation voltages, and the first accumulator 432 receives the first voltage VDDA and the third voltage HVDDA as operation voltages.

Different from the embodiment in FIG. 4A, the current mirror circuit 433 includes two current mirror stages that transfer current and also transfer the operation voltage range. The current mirror circuit 433 includes transistors MP41~MN44, wherein the transistor MP41~MN42 form a first stage current mirror for transferring current and transferring the operation voltage range from a voltage range HVDDA~GNDA to VDDA~GNDA, and the transistor MP43~MN44 form a second stage current mirror for transferring current and transferring the operation voltage range from a voltage range VDDA~GNDA to VDDA~HVDDA. In this embodiment, the transistor MP41~MN42 receive the first voltage VDDA and the second voltage GNDA as operation voltages, and the transistor MP43~MN44 receive the first voltage VDDA and the third voltage HVDDA as operation voltages. On the other hand, the second signal processing circuit 440 does not include a current mirror circuit, and the second current conveyor 441 and the second accumulator 442 receive the third voltage HVDDA and the second voltage GNDA as operation voltages. As such, the operation current OC of the first accumulator 432 can flow into the second accumulator 442, and hence the charge is reused and power consumption of the signal processing apparatus 402 can be reduced, too.

Figure 4C:
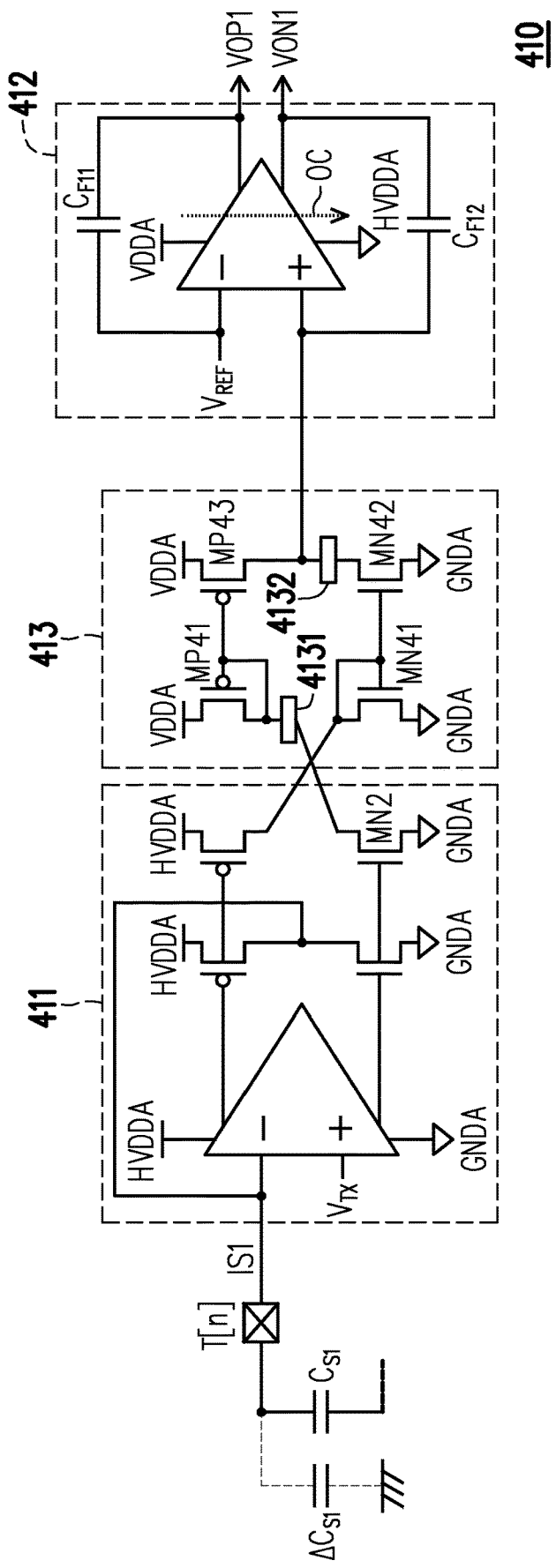
FIG. 4C is another circuit plot of the first signal processing circuit 410 according to the embodiment of FIG. 4A of present disclosure.

FIG. 4C is another circuit plot of the first signal processing circuit 410 according to the embodiment of FIG. 4A of present disclosure. In FIG. 4C, the current mirror circuit 413 includes voltage clamping circuits 4131 and 4132. The voltage clamping circuit 4131 is disposed between the transistor MP41 and the transistor MN2, and the voltage clamping circuit 4132 is disposed between the transistor MP43 and the transistor MN42. By using the clamping circuit 4131 and 4132, the transistors MN2 and MN42 can be avoid to be stressed by a high voltage. That is, the transistors MN2 and MN42 can be implemented by lower voltage endurance transistors, and cost of circuit can be reduced.

Figure 4D:
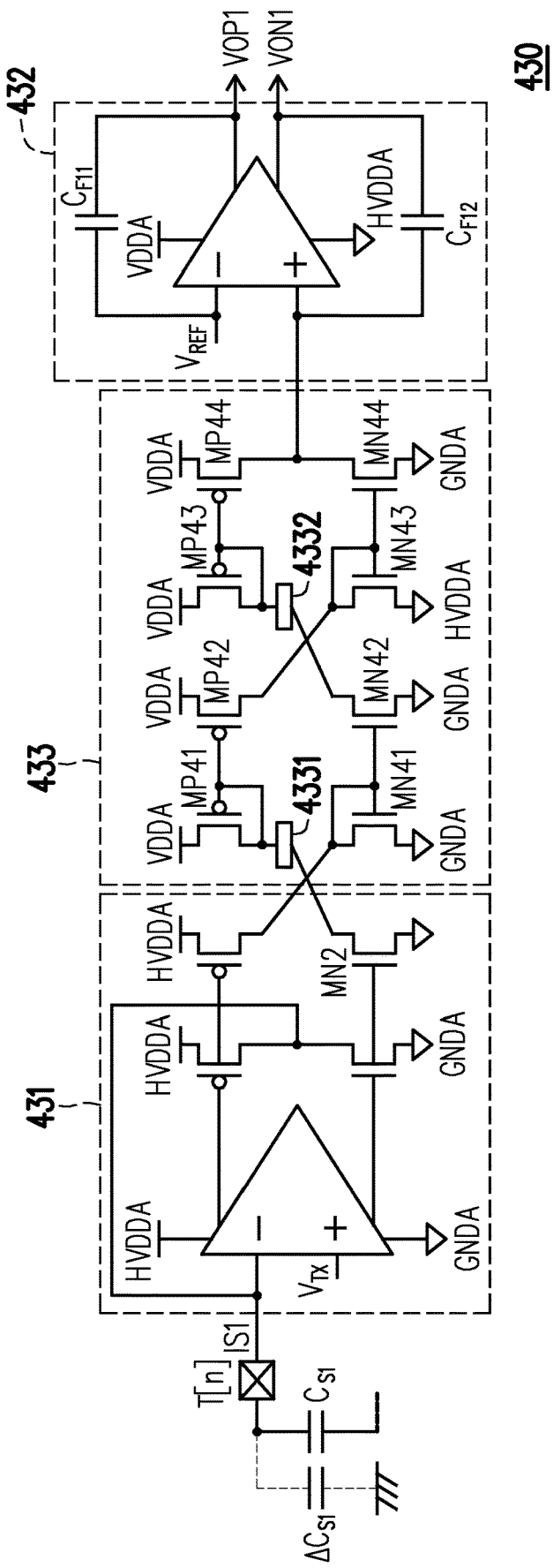
FIG. 4D is another circuit plot of the first signal processing circuit 430 according to the embodiment of FIG. 4B of present disclosure.

FIG. 4D is another circuit plot of the first signal processing circuit 430 according to the embodiment of FIG. 4B of present disclosure. In FIG. 4D, the current mirror circuit 433 includes voltage clamping circuits 4331 and 4332. The voltage clamping circuit 4331 is disposed between the transistor MP41 and the transistor MN2, and the voltage clamping circuit 4332 is disposed between the transistor MP43 and the transistor MN42. By using the clamping circuit 4331 and 4332, the transistors MN2 and MN42 can be avoid to be stressed by a high voltage. That is, the transistors MN2 and MN42 can be implemented by lower voltage endurance transistors, and cost of circuit can be reduced.

Figure 5:
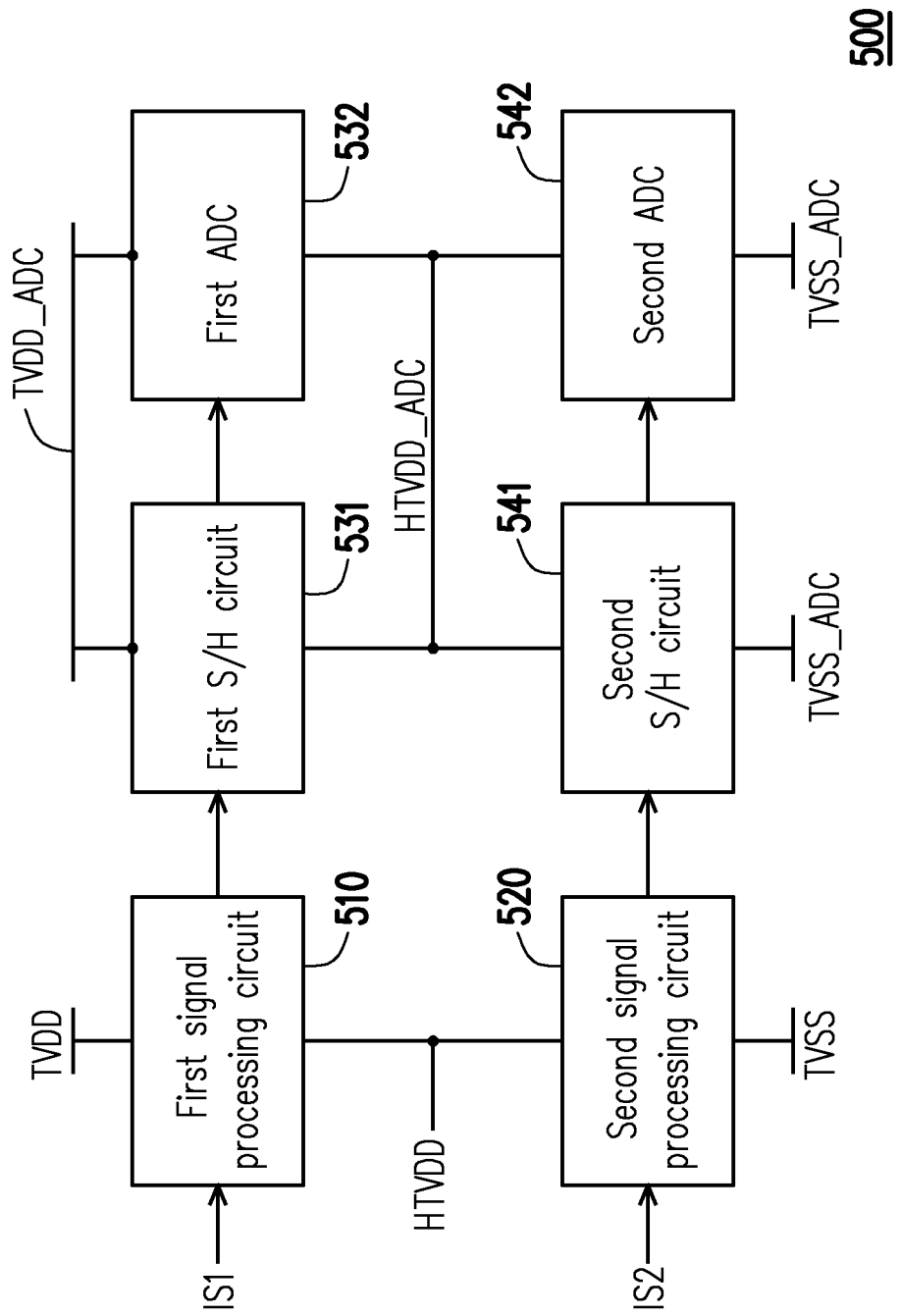
FIG. 5 is a schematic diagram of another signal processing apparatus according to one embodiment of present disclosure.

FIG. 5 is a schematic diagram of another signal processing apparatus according to one embodiment of present disclosure. The signal processing apparatus 500 includes a first signal processing circuit 510 and a second signal processing circuit 520, and further includes a first sample and hold (S/H) circuit 531, a first analog to digital converter (ADC), a second S/H circuit 541 and a second ADC 542. The first signal processing circuit 510 receives a first voltage TVDD and a third voltage HTVDD as operation voltages, and the second signal processing circuit 520 receives the third voltage HTVDD and a second voltage TVSS as operation voltages. Furthermore, the first S/H circuit 531 and the first ADC 532 are coupled in series, and the first S/H circuit 531 receives an accumulation result from the first signal processing circuit 510. Furthermore, power ends of the first S/H circuit 531 and the first ADC 532 are coupled to each other, and the power ends of the first S/H circuit 531 and the first ADC 532 receive a fourth voltage TVDD_ADC. Reference ground ends of the first S/H circuit 531 and the first ADC 532 are also coupled to each other, and the reference ground ends of the first S/H circuit 531 and the first ADC 532 receive a fifth voltage HTVDD_ADC. In this embodiment, a voltage level of the fifth voltage HTVDD_ADC is smaller than a voltage level of the fourth voltage TVDD_ADC.

On the other hand, the second S/H circuit 541 and the second ADC 542 are coupled in series, and the second S/H circuit 541 receives an accumulation result from the second signal processing circuit 520. Furthermore, power ends of the second S/H circuit 541 and the second ADC 542 are coupled to each other, and the power ends of the second S/H circuit 541 and the second ADC 542 receive the fifth voltage HTVDD_ADC. Reference ground ends of the second S/H circuit 541 and the second ADC 542 are also coupled to each other, and the reference ground ends of the second S/H circuit 541 and the second ADC 542 receive a sixth voltage TVSS_ADC. In this embodiment, a voltage level of the fifth voltage HTVDD_ADC is larger than a voltage level of the sixth voltage TVSS_ADC.

It can be seen, the first S/H circuit 531 and the second S/H circuit 541 can share a same operation current, and the first ADC 532 and the second ADC 542 can share another same operation current, and power consumption can be further reduced.

Figure 6:
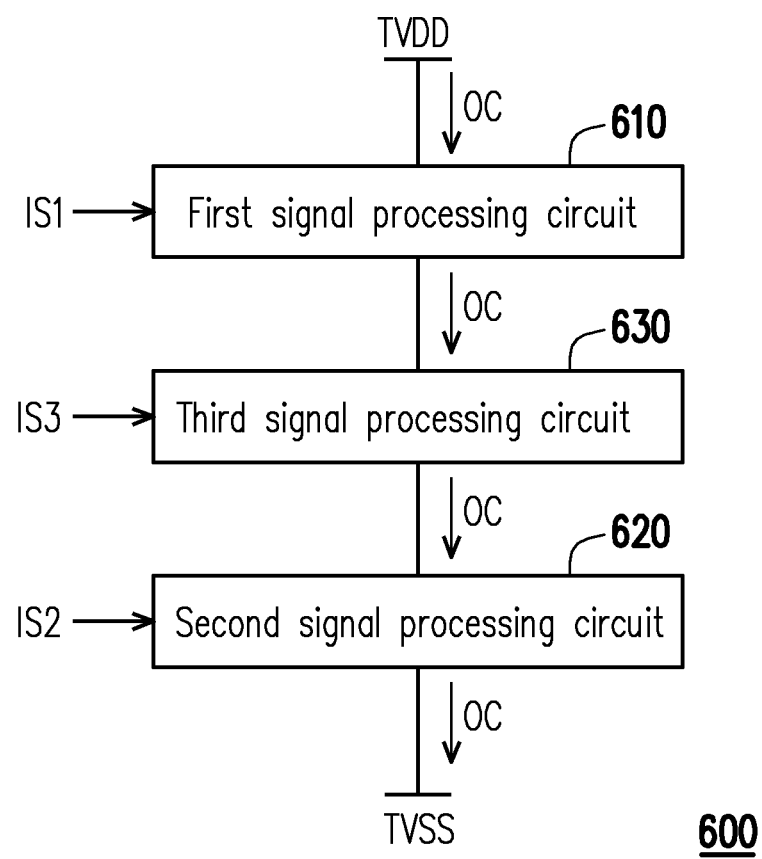
FIG. 6 is a schematic diagram of another signal processing apparatus according to another embodiment of present disclosure.

FIG. 6 is a schematic diagram of another signal processing apparatus according to another embodiment of present disclosure. The signal processing apparatus 600 includes a first signal processing circuit 610, a second signal processing circuit 620 and a third signal processing circuit 630. The first signal processing circuit 610, the third signal processing circuit 630 and the second signal processing circuit 620 are cascade connected between a first voltage TVDD and a second voltage TVSS in sequence, and the first signal processing circuit 610, the third signal processing circuit 630 and the second signal processing circuit 620 are used to respectively receive a first signal IS1, a third signal IS3, and the second signal IS2. An operation current OC can flow from the first voltage TVDD through the first signal processing circuit 610, the third signal processing circuit 630, and the second signal processing circuit 620 to the second voltage TVSS. By sharing the same operation current OC, power consumption of the signal processing apparatus 600 can be reduced.

Figure 7A:
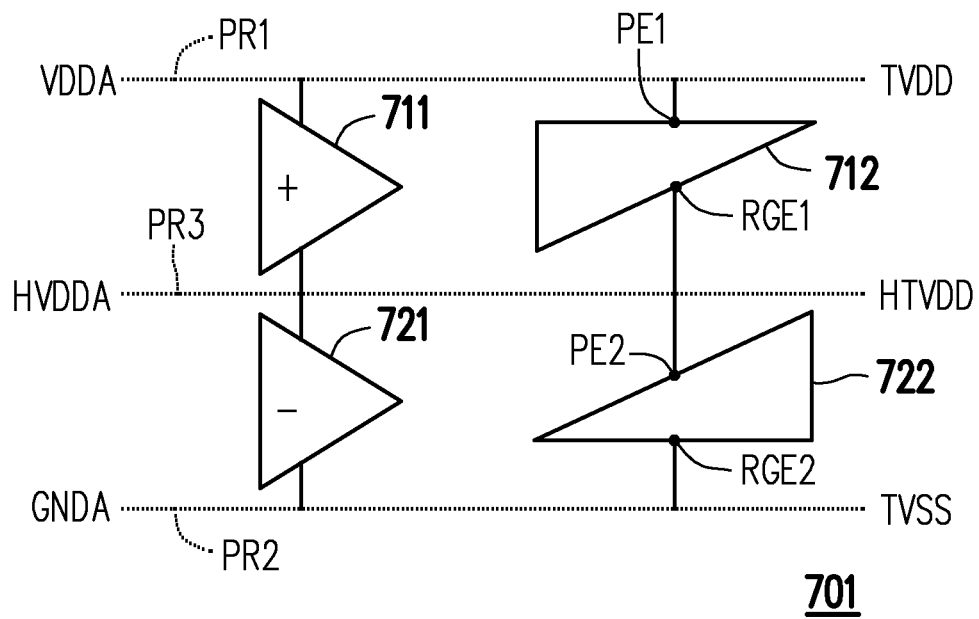
FIG. 7A to FIG. 7C are schematic diagrams of a plurality of touch display driving device according to different embodiments of present disclosure.
Figure 7B:
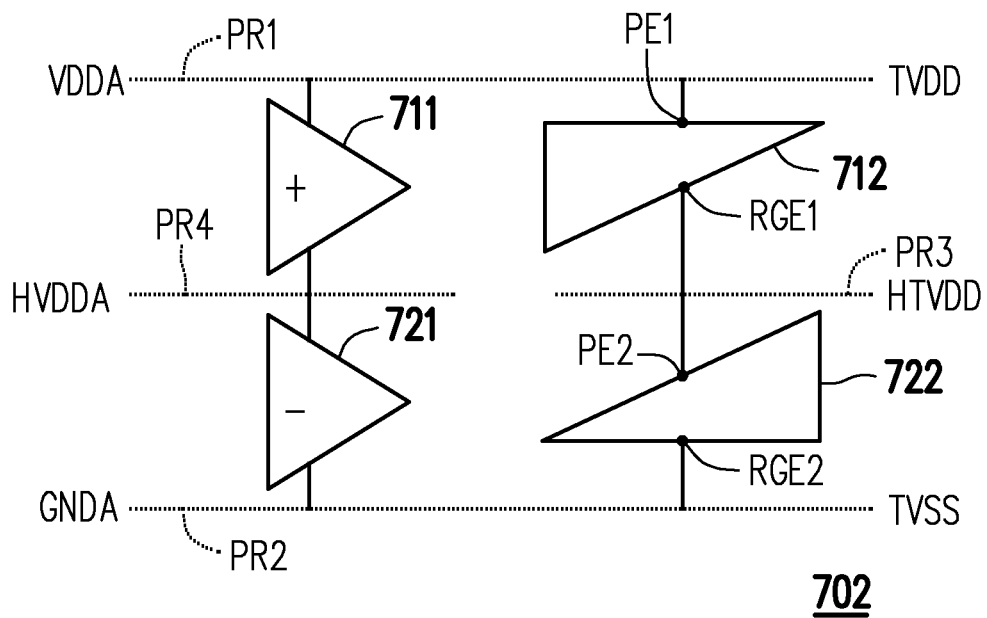
Figure 7C:
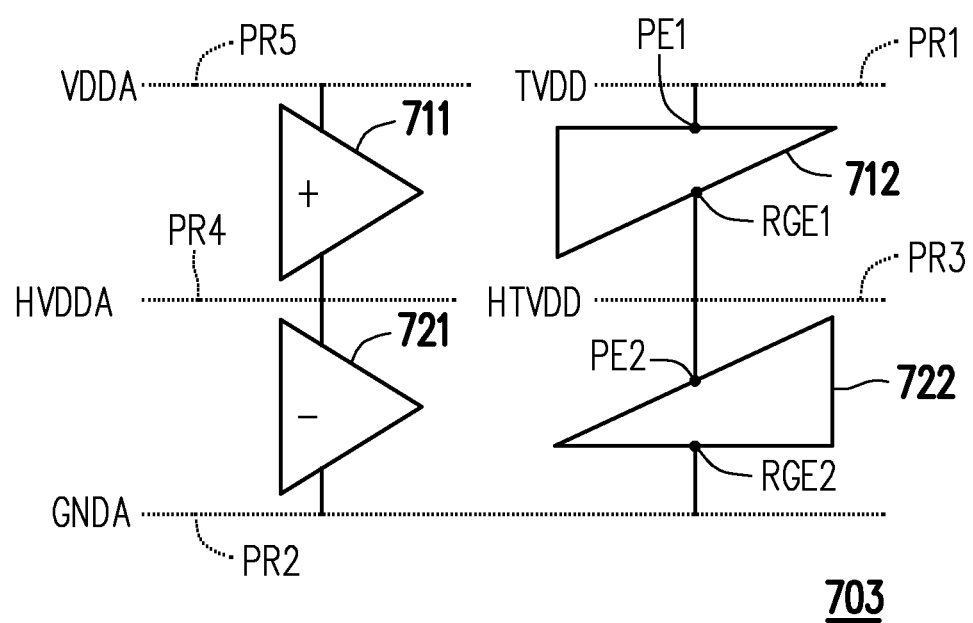

FIG. 7A to FIG. 7C are schematic diagrams of a plurality of touch display driving devices according to different embodiments of present disclosure. The touch display driving device is an integrated circuit (IC) installed in a touch display apparatus, such as a mobile phone, a tablet computer with touch function, a TV with touch function, etc., utilized for driving a touch display panel of the touch display apparatus. Touch display driving device 701, 702 or 703 in FIG. 7A to FIG. 7C may be implemented based on the circuit structure of any one of the signal processing apparatus depicted in FIG. 1 to FIG. 4D. In FIG. 7A, a touch display driving device 701 includes touch analog front-end (AFE) circuits 712 and 722 and a data driving circuit which includes a plurality of driving channels 711 and a plurality of driving channels 721. The touch sensor array may include a plurality of touch electrodes. For example, a plurality of display common electrodes may be connected to form a touch sensor. The display panel and the touch sensor array in present embodiment may be applied by any touch display panel well-known by a person skilled in this art, and no more limitation here.

The plurality of driving channels 711 is utilized for outputting data voltages of positive polarity, which are operated in a voltage range VDDA~HVDDA, and the plurality of driving channels 721 is utilized for outputting data voltages of negative polarity, which are operated in a voltage range HVDDA~GNDA. A power end PE1 of the touch AFE circuit 712 is coupled to a power rail PR1 for receiving a first voltage TVDD which equals a voltage VDDA, and a reference ground end RGE1 of the touch AFE circuit 712 is coupled to a power rail PR3 for receiving a third voltage HTVDD which equals a voltage HVDDA (as a common voltage). A power end PE2 of the touch AFE circuit 722 is coupled to the power rail PR3 for receiving the third voltage HTVDD, and a reference ground end RGE2 of the touch AFE circuit 722 is coupled to a power rail PR2 for receiving a second voltage TVSS, which equals a voltage GNDA. Wherein, voltage level of the first voltage TVDD is larger than a voltage level of the third voltage HTVDD, and the voltage level of the third voltage HTVDD is larger than a voltage level of the second voltage TVSS.

Power ends of the driving channels 711 are coupled to the power rail PR1 for receiving the voltage VDDA, and reference ground ends of the driving channels 711 are coupled to the power rail PR3 for receiving the third voltage HVDDA. The driving channels 711 receive the voltage VDDA and the voltage HVDDA as operation voltages. Furthermore, power ends of the driving channels 721 are coupled to the power rail PR3 for receiving the voltage HVDDA, and reference ground ends of the driving channels 721 are coupled to the power rail PR2 for receiving the voltage GNDA. The driving channels 721 receive the voltage HVDDA and the voltage GNDA as operation voltages. In here, the driving channels 711 and 721 are all hardware circuits and can implemented by analog or mixed mode circuits structure.

In this embodiment, the driving channels 711 and 721 and the touch AFE circuits 712 and 722 can use same operation voltages, and power consumption thereof can be reduced, too.

In FIG. 7B, in a touch display driving device 702, the reference ground ends of the driving channels 711 and the power ends of the driving channels 721 may be commonly coupled to a power rail PR4 which is different form the power rail PR3. A power end PE1 of the touch AFE circuit 712 is coupled to a power rail PR1 for receiving a first voltage TVDD which equals the voltage VDDA. A power end PE2 of the touch AFE circuit 722 is coupled to the power rail PR3 for receiving the third voltage HTVDD, which is different from the voltage HVDDA (a common voltage) coupled to the driving channel 711 and the driving channel 712. A reference ground end RGE2 of the touch AFE circuit 722 is coupled to a power rail PR2 for receiving a second voltage TVSS, which equals the voltage GNDA. The driving channels 711 and 721 and the touch AFE circuits 712 and 722 can use same highest and lowest operation voltages (but use different common voltages), and power consumption thereof can be reduced, too.

In FIG. 7C, in a touch display driving device 703, the power end of the driving channels 711 may be coupled to a power rail PR5 which is different from the power rail PR1. A voltage VDDA can be applied to the power rail PR5, and the voltage VDDA may be different from the first voltage TVDD. The driving channels 711 and 721 and the touch AFE circuits 712 and 722 can use same lowest operation voltages, and power consumption thereof can be reduced, too.

In summary, present disclosure provides the signal processing apparatus having a plurality of signal processing circuits coupled in series between two operation voltages. An operation current can flow through form a first signal processing circuit to a last signal processing circuit, and the operation current is shared by the signal processing circuits. That is, power consumption of the signal processing apparatus can be reduced.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A signal processing apparatus, comprising:
a first signal processing circuit, for receiving a first signal, wherein the first signal processing circuit has a power end connecting to a first voltage and a reference ground end; and
a second signal processing circuit, for receiving a second signal, wherein the second signal processing circuit has a power end which is electrically coupled to the reference ground end of the first signal processing circuit or equals the reference ground end of the first signal processing circuit, and the second signal processing circuit has a reference ground end connecting to a second voltage,
wherein the reference ground end of the first signal processing circuit and the power end of the second signal processing circuit connect to a third voltage, where the first voltage is larger than the second voltage, and the third voltage is equivalent to a half of a voltage summation of the first voltage and the second voltage,
wherein both of the first signal processing circuit and the second signal processing circuit are analog front end circuits for processing touch sensing signals, and the first signal and the second signal are analog touch sensing signals received from a touch sensor array of a touch display panel,
wherein the first signal processing circuit comprises:
a first current conveyor, receiving the first voltage and the second voltage as operation voltages, the first current conveyer generating a first current signal according to the first signal; and
a first accumulator, coupled to the first current conveyor circuit, receiving the first voltage and the third voltage as operation voltages, receiving the first current signal, and generating a first accumulating result signal according to the first current signal and a first reference signal;
and wherein the second signal processing circuit comprises:
a second current conveyor, receiving the first voltage and the second voltage as operation voltages, the second current conveyer generating a second current signal according to the second signal; and
a second accumulator, coupled to the second current conveyor circuit, receiving the third voltage and the second voltage as operation voltages, receiving the second current signal, and generating a second accumulating result signal according to the second current signal and a second reference signal.

2. The signal processing apparatus as claimed in claim 1, wherein a first operation current of the first signal processing circuit flows from the power end of the first signal processing circuit to the reference ground end of the first signal processing circuit, and a second operation current of second signal processing circuit flows from the power end of the second signal processing circuit to the reference ground end of the second signal processing circuit, wherein the first operation current equals to the second operation current.

3. The signal processing apparatus as claimed in claim 1, wherein the first current conveyor comprises:
a first voltage follower, having a negative input end for receiving the first signal, a positive input end for receiving the driving signal, and an output end coupled to the negative input end and generating the first current signal; and
a first output buffer, coupled to the first voltage follower, and transferring the first current signal to the first accumulator;
and wherein the second current conveyor comprises:
a second voltage follower, having a negative input end for receiving the second signal, a positive input end for receiving the driving signal, and an output end coupled to the negative input end and generating the second current signal; and
a second output buffer, coupled to the second voltage follower, and transferring the second current signal to the second accumulator.

4. The signal processing apparatus as claimed in claim 1, wherein the first accumulator comprises:
a first operation amplifier, having a negative input end for receiving the first reference signal, and a positive input end for receiving the first current signal;
a first capacitor, coupled between the negative input end of the first operation amplifier and a first output end of the first operation amplifier; and
a second capacitor, coupled between the positive input end of the first operation amplifier and a second output end of the first operation amplifier,
and wherein the second accumulator comprises:
a second operation amplifier, having a negative input end for receiving the second reference signal, and a positive input end for receiving the second current signal;
a third capacitor, coupled between the negative input end of the second operation amplifier and a first output end of the second operation amplifier; and
a fourth capacitor, coupled between the positive input end of the second operation amplifier and a second output end of the second operation amplifier.

5. The signal processing apparatus as claimed in claim 1, further comprising:
a first sample and hold circuit, coupled to the first signal processing circuit for receiving a first accumulation result generated by the first signal processing circuit;
a first analog to digital converter, coupled to the first sample and hold circuit;
a second sample and hold circuit, coupled to the second signal processing circuit for receiving a second accumulation result generation by the second signal processing circuit; and
a second analog to digital converter, coupled to the second sample and hold circuit;
wherein power ends of the first sample and hold circuit and the first analog to digital converter are coupled to each other, reference ground ends of the first sample and hold circuit and the first analog to digital converter are coupled to each other, power ends of the second sample and hold circuit and the second analog to digital converter are coupled to each other, and reference ground ends of the second sample and hold circuit and the second analog to digital converter are coupled to each other, and wherein the reference ground ends of the first sample and hold circuit and the first analog to digital converter are as the power ends of the second sample and hold circuit and the second analog to digital converter.

6. The signal processing apparatus as claimed in claim 1, further comprising:
a third signal processing circuit, for receiving a third signal, wherein the third signal processing circuit has a third power end connecting to the reference ground end of the first signal processing circuit, and has a reference ground end connecting to the power end of the second signal processing circuit.

7. The signal processing apparatus as claimed in claim 6, wherein the power end of the third signal processing circuit receives a third voltage, and the reference ground end of the third signal processing circuit receives a fourth voltage, where the first voltage>the third voltage>the fourth voltage>the second voltage.

8. A touch display apparatus, comprising:
a display panel, integrated with a touch sensor array, wherein the touch sensor array comprises a plurality of touch electrodes; and
a touch display driving device, comprising:
a first touch analog front-end circuit, coupled to a first touch electrode of the touch sensor array for receiving a first signal from the first touch electrode, wherein the first touch analog front-end circuit has a power end connecting to a first voltage and a reference ground end; and
a second touch analog front-end circuit, coupled to a second touch electrode of the touch sensor array for receiving a second signal from the second touch electrode, wherein the second touch analog front-end circuit has a power end which is electrically coupled to the reference ground end of the first touch analog front-end circuit or equals the reference ground end of the first touch analog front-end circuit, and the second touch analog front-end circuit has a reference ground end connecting to a second voltage,
wherein the reference ground end of the first touch analog front-end circuit and the power end of the second touch analog front-end circuit connect to a third voltage, where the first voltage is larger than the second voltage, and the third voltage is equivalent to a half of a voltage difference between the first voltage and the second voltage,
wherein the first touch analog front-end circuit comprises:
a first current conveyor, receiving the first voltage and the second voltage as operation voltages, the first current conveyer generating a first current signal according to the first signal; and
a first accumulator, coupled to the first current conveyor circuit, receiving the first voltage and the third voltage as operation voltages, receiving the first current signal, and generating a first accumulating result signal according to the first current signal and a first reference signal;
and wherein the second touch analog front-end circuit comprises:
a second current conveyor, receiving the first voltage and the second voltage as operation voltages, the second current conveyer generating a second current signal according to the second signal; and
a second accumulator, coupled to the second current conveyor circuit, receiving the third voltage and the second voltage as operation voltages, receiving the second current signal, and generating a second accumulating result signal according to the second current signal and a second reference signal.

9. The touch display apparatus as claimed in claim 8, wherein a first operation current of the first touch analog front-end circuit flows from the power end of the first touch analog front-end circuit to the reference ground end of the first touch analog front-end circuit, and a second operation current of second touch analog front-end circuit flows from the power end of the second touch analog front-end circuit to the reference ground end of the second touch analog front-end circuit, wherein the first operation current equals to the second operation current.

10. The touch display apparatus as claimed in claim 9, wherein the touch display driving device further comprises a data driving circuit comprising a plurality of first driving channels for outputting data voltages of positive polarity and a plurality of second driving channels for outputting data voltages of negative polarity, and wherein the plurality of first driving channels are coupled to a first power rail, the plurality of second driving channels are coupled to a second power rail, and the plurality of first and second driving channels are coupled to a third power rail which provides a common voltage.

11. The touch display apparatus as claimed in claim 10, wherein the power end of the first touch analog front-end circuit is coupled to the first power rail, the reference ground end of the second touch analog front-end circuit is coupled to the second power rail, and the reference ground end of the first touch analog front-end circuit and the power end of the second touch analog front-end circuit are coupled to the third power rail.

12. The touch display apparatus as claimed in claim 10, wherein the power end of the first touch analog front-end circuit is coupled to the first power rail, and the reference ground end of the second touch analog front-end circuit is coupled to the second power rail.

13. The touch display apparatus as claimed in claim 10, wherein the reference ground end of the second touch analog front-end circuit is coupled to the second power rail.

14. A signal processing apparatus, comprising:
a first signal processing circuit, for receiving a first signal, wherein the first signal processing circuit has a power end connecting to a first voltage and a reference ground end; and
a second signal processing circuit, for receiving a second signal, wherein the second signal processing circuit has a power end which is electrically coupled to the reference ground end of the first signal processing circuit or equals the reference ground end of the first signal processing circuit, and the second signal processing circuit has a reference ground end connecting to a second voltage,
wherein the reference ground end of the first signal processing circuit and the power end of the second signal processing circuit connect to a third voltage, where the first voltage is larger than the second voltage, and the third voltage is equivalent to a half of a voltage summation of the first voltage and the second voltage,
wherein both of the first signal processing circuit and the second signal processing circuit are analog front end circuits for processing touch sensing signals, and the first signal and the second signal are analog touch sensing signals received from a touch sensor array of a touch display panel,
wherein the first signal processing circuit comprises:

a first current conveyor, receiving the third voltage and the second voltage as operation voltages, the first current conveyer generating a third current signal according to the first signal;

a current mirror circuit, coupled between the first current conveyor and a first accumulator, receiving the first voltage and the second voltage as operation voltages and mirroring the third current signal to generate a first current signal; and the first accumulator, coupled to the current mirror circuit, receiving the first voltage and the third voltage as operation voltages, receiving the first current signal, and generating a first accumulating result signal by accumulating the first current signal according to a first reference signal;

and wherein the second signal processing circuit comprises:

a second current conveyor, receiving the third voltage and the second voltage as operation voltages, the second current conveyer generating a second current signal according to the second signal; and a second accumulator, coupled to the second current conveyor circuit, receiving the third voltage and the second voltage as operation voltages, receiving the second current signal, and generating a second accumulating result signal by accumulating the second current signal according to a second reference signal.

* * * * *